United States Patent [19]
Funada et al.

[11] Patent Number: 5,614,426
[45] Date of Patent: Mar. 25, 1997

[54] METHOD OF MANUFACTURING SEMICONDUCTOR DEVICE HAVING DIFFERENT ORIENTATIONS OF CRYSTAL CHANNEL GROWTH

[75] Inventors: Fumiaki Funada, Nara; Tatsuo Morita, Kyoutohu; Hirohisa Tanaka, Nara; Hongyong Zhang; Toru Takayama, both of Kanagawa, all of Japan

[73] Assignee: Semiconductor Energy Laboratory Co., Ltd., Kanagawa-ken, Japan

[21] Appl. No.: 518,318

[22] Filed: Aug. 23, 1995

Related U.S. Application Data

[62] Division of Ser. No. 286,454, Aug. 5, 1994.

[30] Foreign Application Priority Data

Aug. 10, 1993 [JP] Japan ................................. 5-218156

[51] Int. Cl.⁶ .................................................. H01L 21/84
[52] U.S. Cl. ............................ 437/40; 437/88; 437/233; 437/973; 148/DIG. 16
[58] Field of Search ............................ 437/21, 40 TFT, 437/40 TFI, 41 TFT, 41 TFI, 88, 99, 101, 109, 233, 967, 973; 148/DIG. 16; 257/57, 64, 65, 66, 75

[56] References Cited

U.S. PATENT DOCUMENTS

| | | | |
|---|---|---|---|
| Re. 33,321 | 9/1990 | Magarino et al. | 437/233 |
| 4,933,298 | 6/1990 | Hasegawa | 437/40 TFT |
| 5,147,826 | 9/1992 | Liu et al. | 437/233 |
| 5,275,851 | 1/1994 | Fonash et al. | 437/233 |
| 5,481,121 | 1/1996 | Zhang et al. | 257/64 |
| 5,534,716 | 7/1996 | Takemura | 257/64 |

FOREIGN PATENT DOCUMENTS

| | | |
|---|---|---|
| 2-27320 | 1/1990 | Japan . |
| 2-208635 | 8/1990 | Japan . |

OTHER PUBLICATIONS

C. Hayzelden et al., "In Situ Transmission Electron Microscopy Studies of Silicide–Mediated Crystallization of Amorphous Silicon" Appl. Phys. Lett, 60(1992) 225.

A.V. Dvurechenski et al., "Transport Phenomena in Amorphous Silicon Doped by Ion Implantation of 3rd Metals", Phys. Stat. Sol., A95 (1986) 635.

T. Hempel et al., "Needle–Like Crystallization of Ni Doped Amorphous Silicon Thin Films", *Solid State Communications*, vol. 85, No. 11, pp. 921–924, 1993.

*Primary Examiner*—Charles L. Bowers, Jr.
*Assistant Examiner*—Leon Radomsky
*Attorney, Agent, or Firm*—Sixbey, Friedman, Leedom & Ferguson, P.C.; Gerald J. Ferguson, Jr.

[57] ABSTRACT

In an active matrix type liquid-crystal display device, in a peripheral circuit portion, there is arranged a TFT having a high mobility and capable of allowing a large amount of on-state current to flow. In a pixel portion, there is arranged a TFT having a small off-state current. These TFTs having different characteristics are constituted by using crystalline silicon film whose crystal has grown in a direction parallel with a substrate. That is, an angle formed between a crystal growing direction and a carrier moving direction are made different from each other, thereby to control a resistance imposed on the carriers when moving to determine the characteristics of the TFT. For example, when the crystal growing direction coincides with the carrier moving direction, high mobility can be given to the carriers. Further, when the crystal growing direction is arranged perpendicular to the carrier moving direction, the off-state current can be lowered.

6 Claims, 5 Drawing Sheets

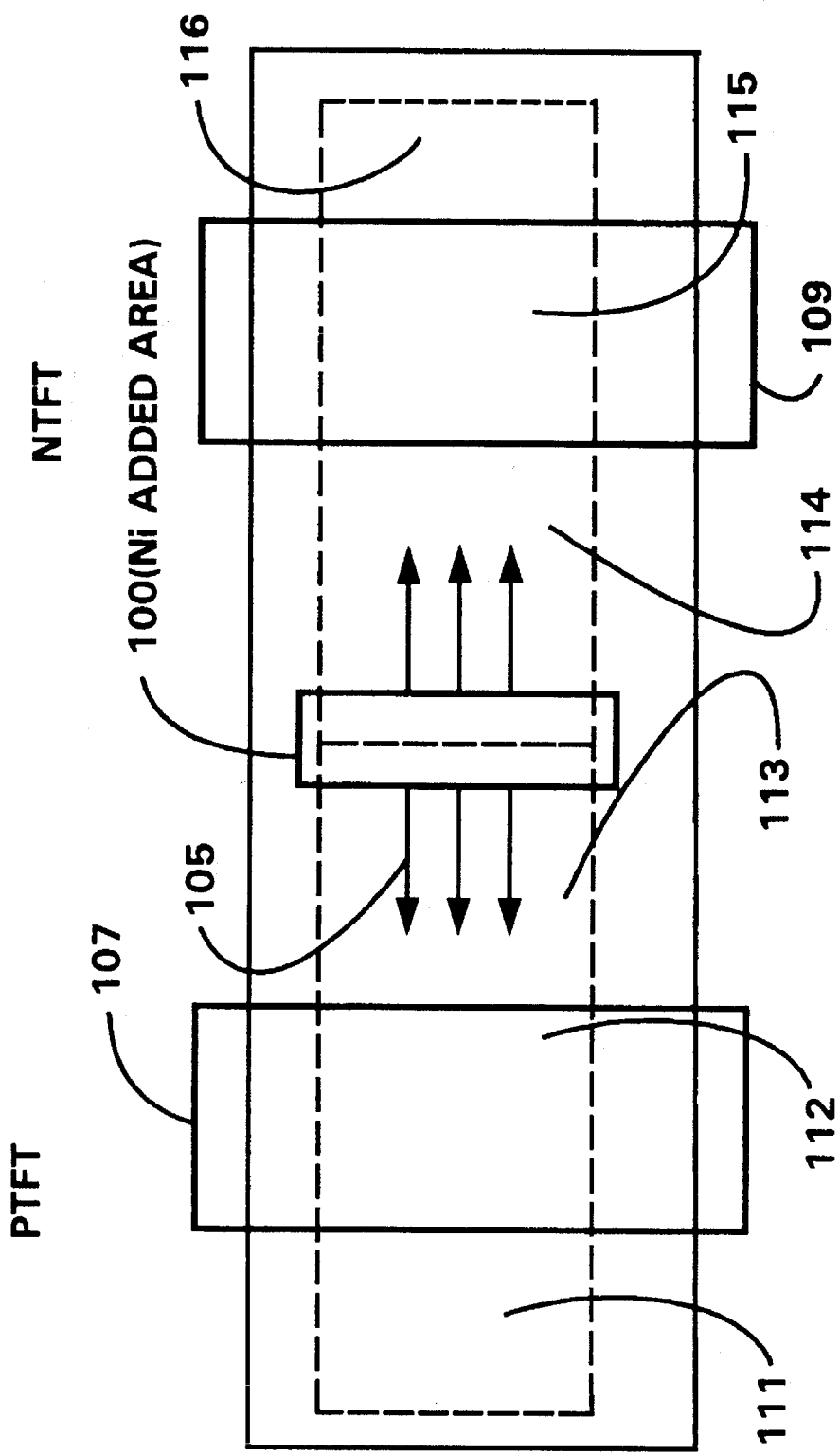

NTFT

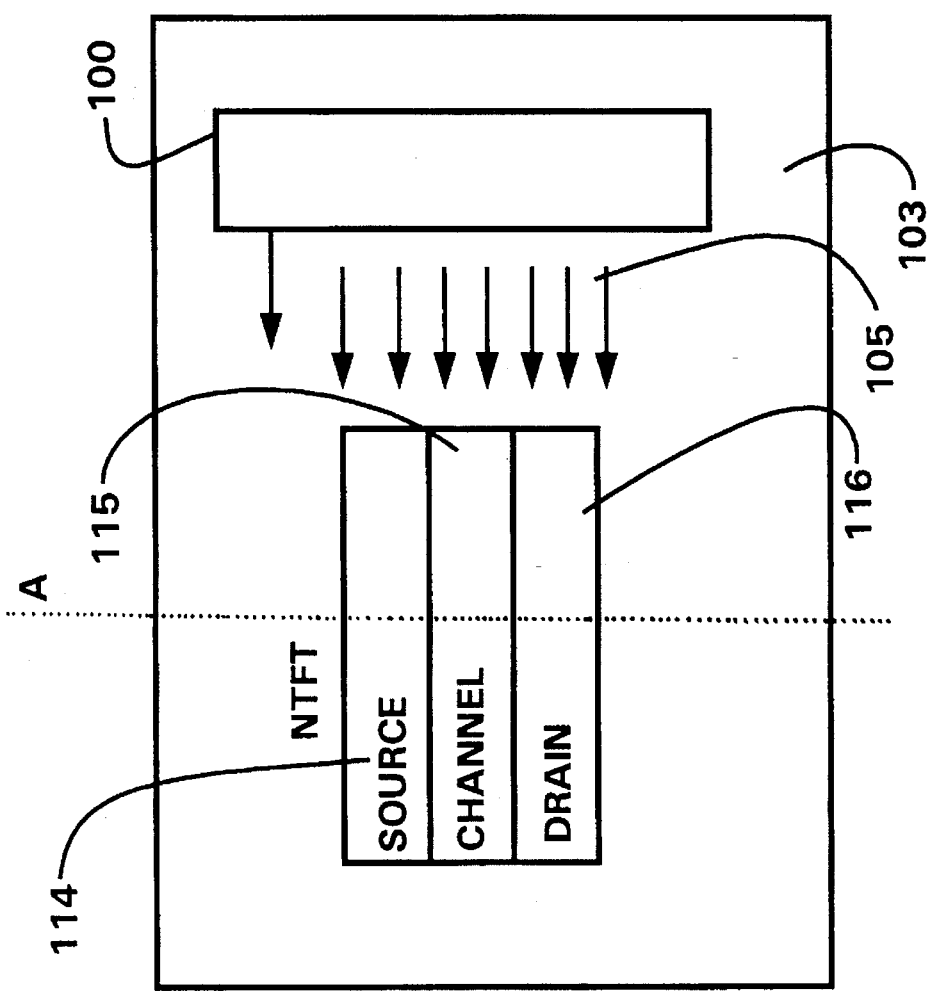

METHOD OF MANUFACTURING SEMICONDUCTOR DEVICE HAVING DIFFERENT ORIENTATIONS OF CRYSTAL CHANNEL GROWTH

This is a Divisional application of Ser. No. 08/286,454, filed Aug. 5, 1994.

BACKGROUND OF THE INVENTION

1. Field of the Invention

The present invention relates to a semiconductor device using a TFT (thin-film transistor) provided on an insulating substrate made of glass or the like, and more particularly to a semiconductor device which can be used in a liquid-crystal display device of the active matrix type.

2. Discussion of the Related Art

As the semiconductor device providing the TFTs on the insulating substrate made of glass or the like, there has been known an image sensor and an active matrix type liquid-crystal display device using these TFTs as a driver for pixels.

It is general to use a thin film-shaped silicon semiconductor for the TFT used in these devices. The thin film-shaped silicon semiconductor is roughly classified into two types, that is, an amorphous silicon semiconductor (a-Si) and a crystalline silicon semiconductor. The amorphous silicon semiconductor is most generally used because it has a low manufacturing temperature and can be relatively readily manufactured by a gas phase method so as to be wealthy in productivity. However, because the amorphous silicon semiconductor is inferior to the crystalline silicon semiconductor in physical properties such as electrical conductivity, it has been strongly demanded to establish a method of manufacturing the TFT formed of the crystalline silicon semiconductor in order to obtain a higher-speed characteristic in the future. As the crystalline silicon semiconductor, there have been known polycrystalline silicon, microcrystalline silicon, amorphous silicon containing crystalline components, and semi-amorphous silicon having an intermediate state between crystalline property and amorphous property, or the like.

As a method of obtaining the thin film silicon semiconductors with these crystalline properties, there have been known the following methods.

(1) Directly forming a crystalline film at the time of film formation.

(2) Forming an amorphous semiconductor film in advance and applying laser beam energy to thereby provide the crystalline property.

(3) Forming an amorphous semiconductor film in advance and applying thermal energy to thereby provide the crystalline property.

However, in the method (1), it is technically difficult to form a film having the excellent semiconductor physical properties uniformly all over the upper surface of a substrate. Further, since the film forming temperature is high, that is, 600° C. or more, there rises such a problem in costs that an inexpensive glass substrate cannot be used. In the method (2), in the case of an example of an excimer laser which is most generally used now, first there rises a problem that a through-put is low because a laser beam applied area is small. Furthermore, the stability of the laser beam is insufficient to uniformly treat the entire upper surface of a large-area substrate, as a result of which it is strongly felt that this method is a technique for the coming generation. In the method (3), there is an advantage that it is capable of coping with the large-area of the substrate in comparison with the methods (1) and (2). However, a high temperature of 600° C. or more is required, and in view of using the inexpensive glass substrate, it is necessary to further lower the heating temperature. In particular, the size of the current liquid-crystal display device is becoming larger, and for that reason, likewise, it is necessary to use a large-scaled glass substrate. When such a large-scaled glass substrate is used, there occurs a serious problem that the contraction or distortion of the substrate in the heating process essential to the semiconductor manufacture deteriorates the accuracy in mask alignment or the like. In particular, in the case of Corning 7059 glass which is most generally used now, the distortion point is 593° C., whereby the conventional heat crystallization method causes the substrate to be largely deformed. Moreover, in addition to the temperature problem, since the current process requires heating time of several tens hours or more for crystallization, it is also necessary to shorten the heating time.

SUMMARY OF THE INVENTION

The present invention has been made to eliminate the above-mentioned problems. More specifically, an object of the present invention is to provide a process of lowering a temperature necessary for crystallization and reducing a time therefor in a method of manufacturing a thin film formed of a crystalline silicon semiconductor by application of a method of crystallizing a thin film formed of an amorphous silicon by heating. The crystalline silicon semiconductor prepared by a process of the present invention has the physical properties equal to or higher than those prepared by the conventional process, and applicable even to the active layer region of a TFT.

Another object of the invention is to selectively provide the TFT with the characteristics required on a substrate by using this technique.

The inventors have conducted the following experiment on the above-mentioned method of forming an amorphous silicon semiconductor film by a CVD method or a sputtering method to crystallize the film thus formed by heating, and considered the experiment result.

First, the mechanism of forming the amorphous silicon film on a glass substrate to crystalize the film by heating has been investigated. As a result, it has been observed that the crystal growth started from an interface between the glass substrate and the amorphous silicon and developed into the columnar shape perpendicular to the front surface of the substrate when the film is thicker than a certain value.

It is considered that the above-mentioned phenomenon is caused by the fact that a crystalline nucleus forming a base of the crystal growth (the seed forming a base of the crystal growth) exists in the interface between the glass substrate and the amorphous silicon film and the crystal grows from the nucleus. Such a crystalline nucleus is considered to be of a bit of impure metallic element which exists on the surface of the substrate or the crystalline component of the glass surface (it is considered that the crystalline component of silicon oxide exists on the surface of the glass substrate as called the crystallized glass).

Therefore, it was considered that the temperature of crystallization can be lowered by more positively introducing the crystalline nucleus, and for the purpose of confirming the effect, a bit of other metals was formed on the substrate, and a thin film made of the amorphous silicon was then formed thereon. Thereafter, an experiment of crystallization by heating was conducted. As a result, it was confirmed that, in the case of forming several metals on the substrate, the temperature of crystallization was lowered, and it was expected that there occurred crystal growth which had the foreign matter as the crystalline nucleus. Therefore, the mechanism of a plurality of impure metals which could lower the temperature has been investigated in more detail. The plurality of impure metals are nickel (Ni), iron (Fe), cobalt (Co), palladium (Pd) and platinum (Pt).

The crystallization can be classified into two stages, that is, an initial nucleus production and the crystal growth developed from the nucleus. The speed of the initial nucleus production was observed by measuring a time up to fine crystals is produced in a dot pattern at a given temperature. The above time was shortened in any cases of the amorphous silicon thin film in which a film made of the above-mentioned impure metals has been formed in advance, and the effect of lowering the temperature of crystallization when the crystalline nucleus was introduced was confirmed. Further, the growth of a crystal particle after nucleus production was investigated with changing the heating time. As a result, it was observed that even the speed of crystal growth after the nucleus production was remarkably increased in the crystallization of the amorphous silicon thin film formed on the metal film. This is beyond all expectations. This mechanism is not elucidated under existing circumstances, however, it is assumed that a certain catalytic effect occurs.

In any case, it was ascertained that, in the case of forming a thin film made of amorphous silicon on a film containing a bit of metal of a certain kind and thereafter crystallizing it by heating with the above-mentioned two effects, the sufficient crystal properties could be obtained at a temperature of 580° C. or less for about four hours, which could not be conventionally expected. Among the impure metals having such effects, material which has the most remarkable effect and material which is selected by the inventors is nickel.

An example of how nickel provides the effect will be described. In the case where a thin film made of amorphous silicon formed by a plasma CVD method on a substrate (Corning 7059) which is not subjected to any processing, that is, on which a thin film made of a small amount of nickel is not formed, is crystallized by heating in a nitrogen atmosphere, if a heating temperature is 600° C., a heating time of 10 hours or more is required. However, in the case of using a thin film made of amorphous silicon formed on a substrate on which a thin film made of a small amount of nickel has been formed, the same crystallized state could be obtained by heating for about four hours. At this time, the judgement of crystallization was made by using a Raman spectroscopic spectrum. As is apparent even from this fact, the effect of nickel is very large.

As is understood from the above description, in the case where a thin film made of amorphous silicon is formed on a thin film made of a small amount of nickel, it is possible to lower the crystallization temperature and to shorten a time required for crystallizing. On the assumption that this process is used for manufacturing the TFT, description will be given in more detail. Although it will be described later, even if the thin film of nickel is formed not only on the substrate (that is, underside of the amorphous silicon film) but also on the amorphous silicon film, the same effect could be obtained, and it is the same as in the case of ion implantation and also plasma process. Therefore, hereinafter, in this specification, a sequence of these processes are referred to as "addition of a small amount of nickel." Also, it would be possible to add a small amount of nickel when forming the amorphous silicon film.

First, a method of adding a small amount of nickel will be described.

It is ascertained that the addition of a small amount of nickel may be made by a method of forming a thin film made of a small amount of nickel on a substrate and then forming a film made of amorphous silicon, or by forming the film of amorphous silicon in advance and then forming the thin film of the small amount of nickel, because both the methods have the temperature lowering effect likewise, and the film forming methods can be made by a sputtering method, a vapor deposition method, a CVD method and a method using plasma so as not to be limited to or by a specific method. However, when the thin film made of a small amount of nickel is formed on the substrate, it is remarkable in effect to form a thin film (underlying film) made of silicon oxide on a Corning 7059 glass substrate and then to form the thin film made of a small amount of nickel thereon rather than to form the thin film made of a small amount of nickel directly on the Corning 7059 substrate. It is considered that this is because it is significant for crystallization at a low temperature in this case to bring silicon in direct contact with nickel, and in the case of the Corning 7059 type glass, the components other than silicon impede the contact or reaction between silicon and nickel.

As the method of adding a small amount of nickel, even in the case of adding nickel by ion implantation in place of forming the thin film of nickel in contact with the upper or lower portion of amorphous silicon, the substantially same effect was confirmed. As the amount of nickel, when the amount of $1\times10^{15}$ atoms/cm$^3$ or more is added, the decrease of crystallization temperature was confirmed. However, when the adding amount is $5\times10^{19}$ atoms/cm$^3$ or more, the shape of a peak of the Raman spectroscopic spectrum is clearly different from that of silicon simple substance. Therefore, a range of $1\times10^{15}$ atoms/cm$^3$ to $1\times10^{19}$ atoms/cm$^3$ is preferable. When the density of nickel is $5\times10^{19}$ atoms/cm$^3$ or more, NiSi is locally produced to thereby deteriorate the characteristics of the semiconductor. When the density of nickel is $1\times10^{15}$ atoms/cm$^3$ or less, the catalytic effect of nickel is deteriorated. In the crystallized state, as the density of nickel is lower, more excellent effect is obtained.

Subsequently, the crystal morphology in the case of adding a small amount of nickel will be described. As mentioned above, in the case of adding no nickel, it is known that nucleuses occur from crystalline nucleuses such as the interface of a substrate or the like at random, crystals also grow from the nucleuses at random to a film thickness of a certain degree, and as to the still thicker thin film, columnar crystal growth whose (110) orientation is generally arrayed in a direction perpendicular to the substrate is made. Naturally, it was observed that the crystal grows substantially uniformly over the entire thin film. On the contrary, in the case of the TFT to which a small amount of nickel is added at this time, there is the characteristic that crystal growth is different between a region to which nickel is added and a portion close to that region. That is, in the region to which nickel has been added, it is ascertained through the transmission electron beam microphotograph that the added nickel or the compound of nickel and silicon constitutes a crystal nucleus, and likewise as in the case where nickel is not added, that a columnar crystal substantially perpendicular to the substrate grows. Then, even in the region close to the above region where a small amount of nickel is not directly added, crystallization at a low temperature was confirmed. At that portion, a specific crystal growth that a crystal grows in the form of a needle or a column in parallel with the substrate was observed. It was observed that the crystal growth in the lateral direction parallel with the substrate grows from the region where a small amount of nickel is added by several hundreds microns at maximum, and also it was found that, as a time is increased and a temperature is elevated, the amount of growth is proportionally increased. As one example, the growth of about 40 μm degree was observed at 550° C. for four hours.

It is considered that the crystals grow in parallel with the substrate from the region where the above-mentioned nickel is directly added in the form of a needle or a column, and the influence of a grain boundary is remarkably small in the growth direction. That is, it can be considered that the influence of the crystal grain boundary in that direction is remarkably small since the crystal growth is developed in the form of a needle or a column.

Here, let us consider the active matrix type liquid-crystal display device. In the active matrix type liquid-crystal display device, it is pointed out that the characteristic required is different between the TFT for a peripheral circuit and the TFT for a pixel portion. That is, the TFT forming a driver for the peripheral circuit needs to have a high mobility in order to allow a large on-state current to flow, whereas the TFT formed on the pixel portion needs to suppress an off-state current in order to increase a charge retention capability instead of increasing the mobility.

Therefore, in the case of using the present invention, the above-mentioned crystalline silicon film whose crystals grew in a direction parallel with the substrate is used, and the TFT used for the peripheral circuit is constituted so that a source and a drain thereof are formed in a direction parallel with the crystal growing direction, whereas the TFT used for the pixels is constituted so that a source and a drain thereof are formed in a direction perpendicular to the crystal growing direction. That is, the TFT used for the peripheral circuit is constituted so that carriers are not affected by the grain boundary as large as possible when the carriers are moved, whereas the TFT used for the pixels is constituted so that the carriers go across the grain boundary when the carriers are moved, thereby providing a high resistance between the source and the drain with the result that the off-state current is lowered.

The above-mentioned structure has the concept that, using the fact that the carriers flow between the source and the drain, the direction of the source and the drain (a direction of a line linking the source and the drain) is made parallel with the above-mentioned crystal growing direction, or made perpendicular thereto, thereby to obtain the TFT having the required characteristics. That is, it has the following fundamental concept. When the carriers are moved, the carriers are moved in a direction parallel with the grain boundary of the crystal which grew in the form of a needle or a column (that is, moved in the direction parallel with the crystal growing direction) or the carriers are moved in a direction perpendicular to the crystal grain boundary which grew in the form of a needle or a column (that is, moved in the direction perpendicular to the crystal growing direction) is selected thereby to obtain a TFT with a high mobility or a TFT with a small off-state current.

When constituting the TFT using the crystalline silicon film whose crystals grew in a direction parallel with the surface of the substrate, the source and drain regions are formed along the crystal growing direction, thereby being capable of obtaining the TFT having the high mobility where the movement of the carriers are not almost affected by the grain boundary. Further, the source and drain regions are formed in a direction perpendicular to the crystal growing direction, whereby the movement of the carriers is affected by the grain boundary, as a result of which the TFT having a small off-state current can be obtained. Then, these TFTs can be distinctively manufactured depending upon how to set the direction of the carriers which move between the source and the drain with respect to the crystal growing direction.

BRIEF DESCRIPTION OF THE DRAWINGS

The accompanying drawings, which are incorporated in and constitute a part of this specification, illustrate embodiments of the invention, and together with the description, serve to explain the objects, advantages and principles of the invention. In the drawings.

FIG. 3 is a schematic diagram showing a semiconductor device in accordance with the embodiment of the present invention; FIG. 5 is a schematic diagram showing a semiconductor device in accordance with the embodiment of the present invention.

DETAILED DESCRIPTION OF THE PREFERRED EMBODIMENTS

An embodiment of the present invention will be described with reference to the accompanying drawings in more detail.

Figure 1:
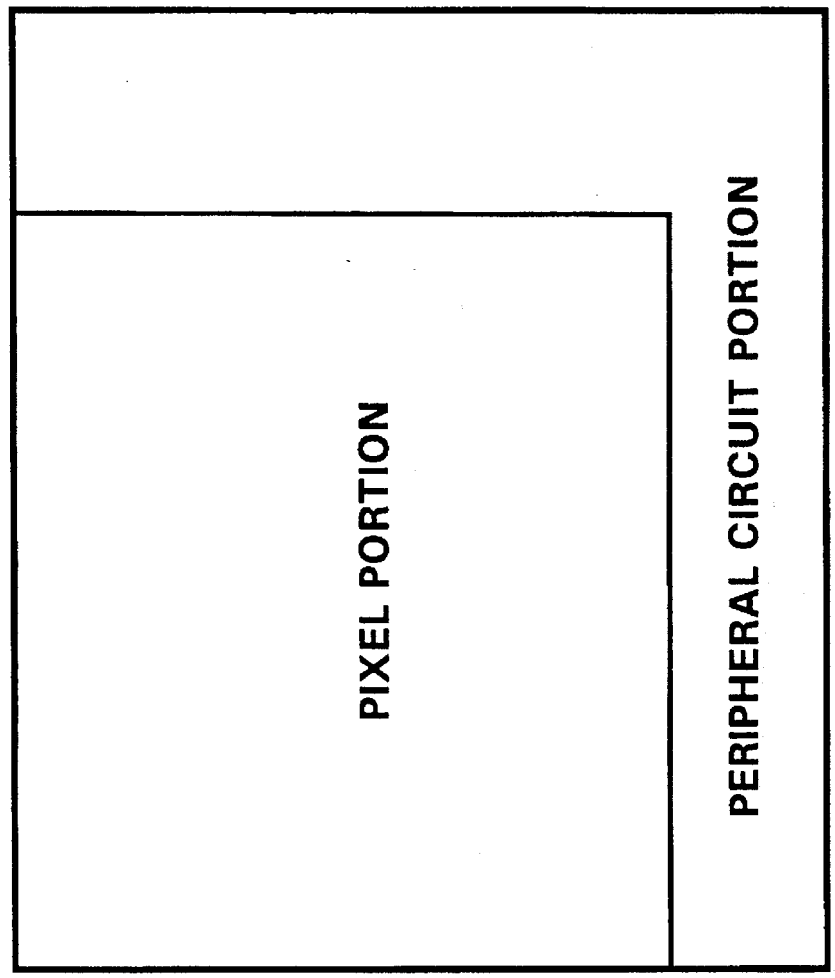
FIG. 1 is a schematic diagram showing a semiconductor device in accordance with an embodiment of the present invention.

FIG. 1 shows an outline of a semiconductor device in accordance with an embodiment of the present invention. FIG. 1 is a liquid-crystal display device viewed from an upper surface thereof, and shows a pixel portion provided in the form of a matrix and a peripheral circuit portion. This embodiment is an example in which a TFT for driving pixels and a TFT constituting a peripheral circuit are formed on an insulating substrate (for example, a glass substrate). In this embodiment, a crystalline silicon film whose crystals grew in a direction parallel with the substrate is used as a semiconductor film constituting the TFT, and the TFT used for the peripheral circuit is arranged so that the direction of moving carriers when the TFT is operated is made in parallel with the crystal growing direction of the crystalline silicon film, whereas the TFT used for the pixel portion is arranged so that the direction of moving the carriers when the TFT is operated is made perpendicular to the crystal growing direction of the crystalline silicon film.

Hereinafter, shown in FIGS. 2A to 2D is a process of manufacturing a complementary circuit of an NTFT and a PTFT constituting the peripheral circuit, and shown in FIGS. 4A to 4D is a process of manufacturing an NTFT which is formed for the pixel. Both of these processes are made on the same substrate, and common processes are simultaneously conducted. That is, FIGS. 2A to 2D correspond to FIGS. 4A to 4D, respectively, in such a manner that the process of FIG.

Figure 2A:
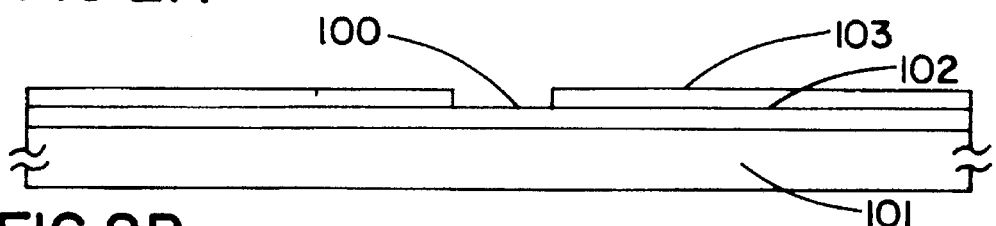
FIGS. 2A to 2D show cross-sectional views showing a process of manufacturing the semiconductor device in accordance with the embodiment of the present invention.
Figure 2B:
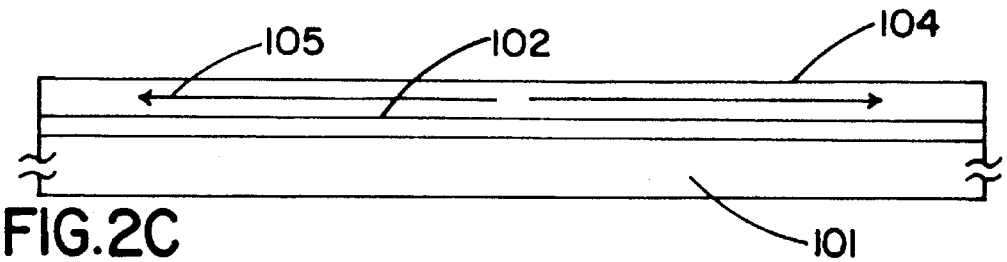
Figure 4A:
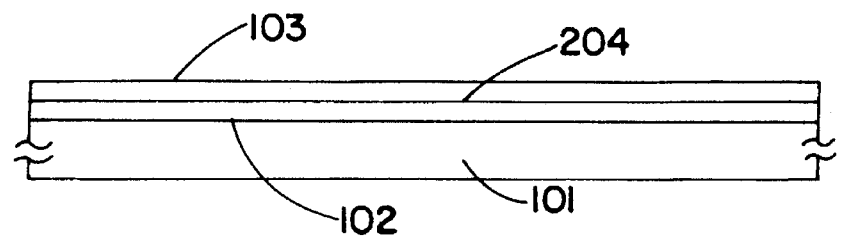
FIGS. 4A to 4D show cross-sectional views showing a process of manufacturing the semiconductor device in accordance with the embodiment of the present invention.
Figure 4B:
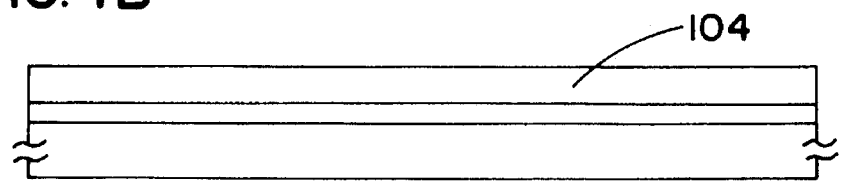

2A and the process of FIG. 4A progress simultaneously, and the process of FIG. 2B and the process of FIG. 4B progress simultaneously.

FIGS. 2A to 2D show a process of manufacturing a complementary circuit of the NTFT and the PTFT constituting the peripheral circuit, whereas FIGS. 4A to 4D show a process of manufacturing the NTFT provided on the pixels. First, an underlying film 102 made of silicon oxide having a thickness of 2000 Å is formed on a glass substrate (Corning 7059) 101 by a sputtering method. Subsequently, a mask 103 formed by a metal mask, a silicon oxide film or the like is formed on the underlying film 102. With the mask 103, the underlying film 102 is exposed in the form of slits. That is, when the state of FIG. 1A is viewed from the top surface, the underlying film 102 is exposed in the form of slits, and other portions are masked. At this time, in the TFT of the pixel portion shown in FIGS. 4A to 4D, there is a portion where the underlying film 102 is exposed in the form of slits on the front side or rear side of the paper surface. This relationship will be described with reference to FIG. 5. In FIG. 5, a section taken along the line A–A' corresponds to FIG. 4C or 4D. In FIGS. 4A to 4D, reference numerals 114 and 116 designate a source region and a drain region, respectively, and reference numeral 115 designates a channel forming region. As shown in FIG. 5, in the process corresponding to FIG. 2A, in a region designated by reference numeral 100, the underlying film 102 is exposed in the form of slits.

After the above-mentioned mask 103 is provided, a nickel silicide film (chemical formula $NiSi_x$, $0.4 \leq x \leq 2.5$, for example, x=) 2.0) having a thickness of 5 to 200 Å, for example, 20 Å is formed thereon by a sputtering method. Thereafter, by removing the mask 103, the nickel silicide film is selectively formed on the region 100. That is, a small mount of nickel is selectively added on the region 100.

Sequentially, an amorphous silicon film 104 of the intrinsic (i)-type having a thickness of 500 to 1500 Å, for example, 1000 Å is formed thereon by a plasma CVD method. Then, the film 104 is annealed at 550° C. for four hours in a hydrogen reducing atmosphere (preferably, the partial pressure of hydrogen is 0.1 to 1 atm) or in an inactive atmosphere (atmospheric pressure) so as to be crystallized. This annealing temperature can be set to 450° C. or more, however, if it is high, this method comes to the same as the conventional method. Therefore, an appropriate annealing temperature is 450° to 550° C.

At this time, in the region 100 where the nickel silicon film has been selectively formed, a silicon film 104 is crystallized in a direction perpendicular to the substrate 101. Then, in a peripheral region of the region 100, as indicated by arrows 105, crystal growth is developed from the region 100 toward a lateral direction (in a direction parallel with the substrate). Then, as will be apparent from the process to be described later, in the TFT of the peripheral circuit portion shown in FIGS. 2A to 2D, the source region and the drain region are formed in the crystal growing direction. Also, as is apparent from FIG. 5, in the TFT provided on the pixel portion, a line linking the source and the drain is orthogonal to the crystal growing direction indicated by the arrows 105. At the time of the above-mentioned crystal growth, a distance of the crystal growth in the direction parallel with the substrate is the degree of 40 μm.

As a result of the above-mentioned process, the amorphous silicon film is crystallized thereby being capable of obtaining the crystalline silicon film 104. Then, separation between elements are made and the unnecessary crystalline silicon film 104 is removed thereby forming an element region. In this process, if the length of the active layers (the source and drain regions and a portion where a channel forming region is formed) of the TFT is set within 40 μm, then the active layer can be constituted by the crystal, line silicon film in FIGS. 2A to 2D. Naturally, if at least the channel forming region is constituted by the crystalline silicon film, the length of the active layer can be still increased.

Thereafter, a silicon oxide film 106 having a thickness of 1000 Å is formed thereon as a gate insulating film by a sputtering method. In sputtering, silicon oxide is used as a target, a temperature of the substrate when sputtering is 200° to 400° C., for example, 350° C., and the sputtering atmosphere contains oxygen and argon where the ratio of argon to oxygen is set to 0 to 0.5, for example, 0.1 or less. Sequentially, a film made of aluminum (containing silicon of 0.1 to 2%) having a thickness of 6000 to 8000 Å, for example, 6000 Å is formed thereon by a sputtering method. It is preferable to successively execute the processes of forming the silicon oxide film 106 and the aluminum film.

Then, the aluminum film is patterned to form gate electrodes 107 and 109. It goes without saying that these processes progress simultaneously in FIGS. 2C and 4C. Furthermore, the surface of the aluminum electrode is subjected to anodic oxidation thereby forming oxide films 108 and 110 on the surface thereof. This anodic oxidation is performed in an ethylene glycol solution containing tartaric acid of 1 to 5% therein. The thickness of the oxide layers 108 and 110 obtained is 2000 Å. Since the oxides 108 and 110 come to the thickness for forming an offset gate region in a succeeding ion doping process, the length of the offset gate region can be determined in the above-mentioned anodic oxidation process.

Figure 2C:
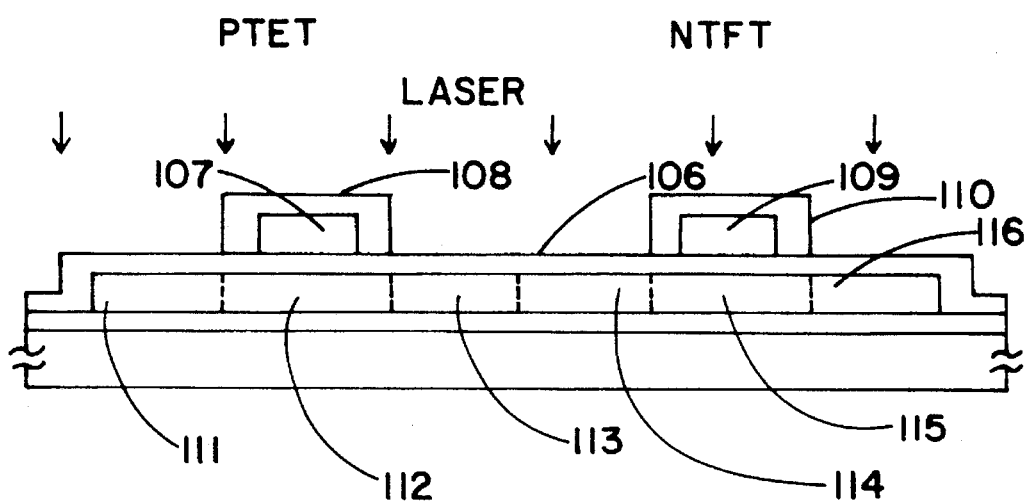
Figure 4C:
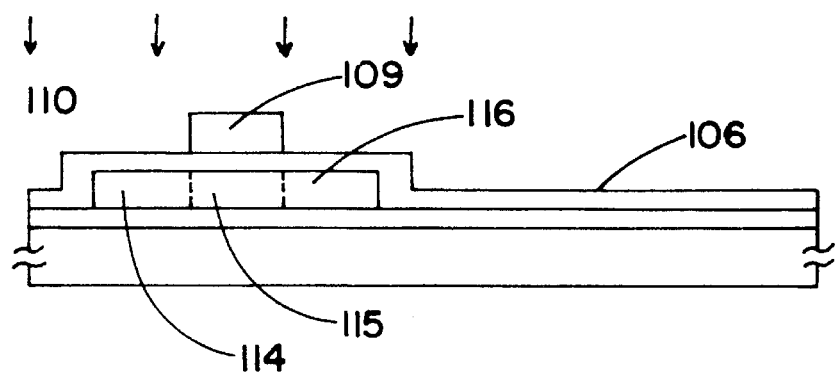

Subsequently, impurities (phosphorus and boron) are implanted in the active regions by an ion doping met, hod with masks of the gate electrode 107, the oxide layer 108 in the periphery thereof, the gate electrode 109 and the oxide layer 110 in the periphery thereof. As doping gas, there are used phosphine ($PH_3$) and diborane ($B_2H_6$), and in the former, accelerating voltage is 60 to 90 kV, for example, 80 kV, whereas in the latter, it is 40 to 80 kV, for example, 65 kV. The dose is $1 \times 10^{15}$ to $8 \times 10^{15}$ $cm^{-2}$, for example, phosphorus is $2 \times 10^{15}$ $cm^{-2}$ whereas boron is $5 \times 10^{15}$ $cm^{-2}$. At the time of doping, a region where no doping is required is covered with a photo-resist so as to selectively dope the respective elements. As a result, n-type impurity regions 114 and 116 and p-type impurity regions 111 and 113 are formed, respectively, thereby forming a region of a p-channel TFT (PTFT) and a region of an n-channel TFT (NTFT), respectively, as shown in FIG. 2C. Also, simultaneously, as shown in FIGS. 4C and 5, an n-channel TFT can be formed.

Thereafter, annealing is conducted by irradiation of a laser beam to activate the impurities resulting from the ion implantation. As the laser beam, there is used a KrF excimer laser (wavelength of 248 nm and pulse width of 20 nsec), however, different kind of lasers may be used. The condition of irradiating the laser beam is that the energy density is 200 to 400 $mJ/cm^2$, for example, 250 $mJ/cm^2$, and 2 to 10 shots, for example, two shots are irradiated per place. It is useful to heat the substrate at about 200 to 450° C. when irradiating the laser beam. In the laser annealing process, since nickel has been diffused in the region which has been crystallized in advance, recrystallization readily progresses by irradiation of the laser beam so that the impurity regions 111 and 113 which have been doped with the impurities giving the p-type as well as the impurity regions 114 and 116 which have been doped with the impurities giving the n-type can be readily activated.

Figure 2D:
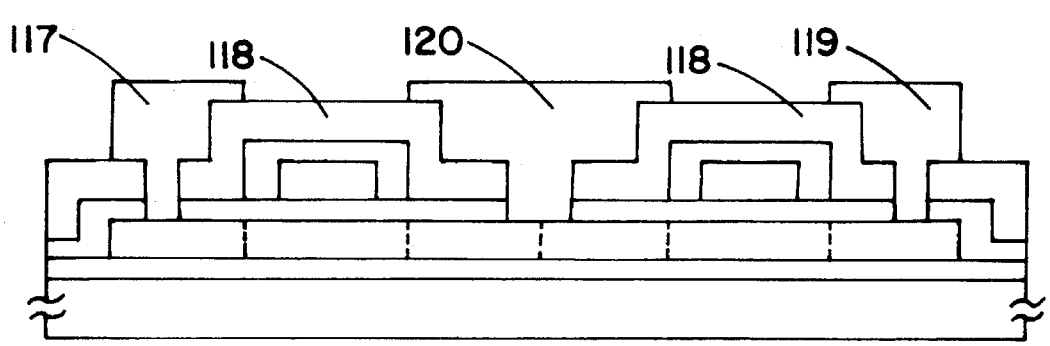
Figure 4D:
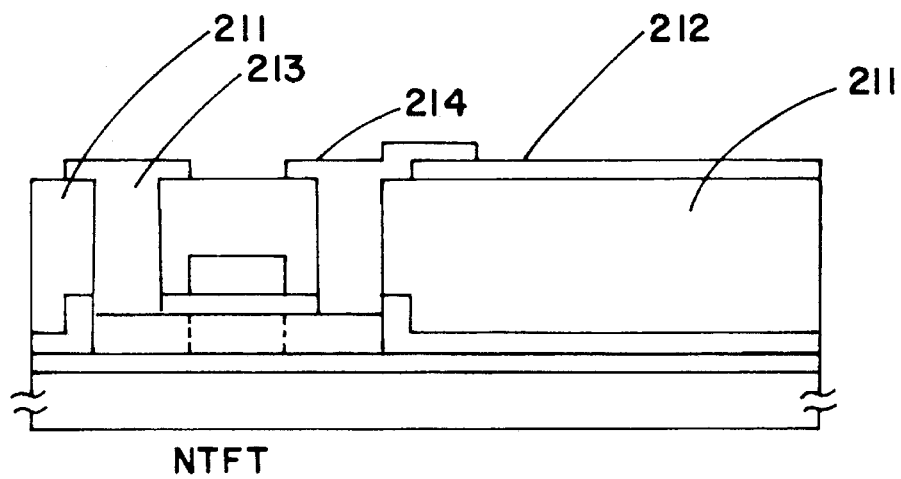

Next, in the peripheral circuit portion, as shown in FIG. 2D, a silicon oxide film 118 having a thickness of 6,000 Å is formed as an interlayer insulator by a plasma CVD method, and then contact holes are formed in the silicon oxide films 118, then electrodes and wirings 117, 120 and 119 of the TFT are formed with a metal material, for example, a multilayer film made of titanium nitride and aluminum. Furthermore, in the pixel portion, as shown in FIG. 4D, after an interlayer insulator 211 is formed of silicon oxide and contact holes are formed therein, an ITO electrode 212 constituting a pixel electrode is formed thereon and metal wirings 213 and 214 are then formed. Finally, annealing is conducted at 350° C. for 30 minutes in the hydrogen atmosphere of 1 atm, thereby to complete a TFT circuit or a TFT (FIGS. 1D and 4D).

In the structure shown in FIG. 2D, in order to show a positional relationship between the region into which nickel is selectively introduced and the TFT, an outline of the semiconductor device in FIG. 2D viewed from a top face is shown in FIG. 3. In FIG. 3, a small amount of nickel is selectively added to the region represented by numeral reference 100, and then crystal growth is developed from that region in a lateral direction (right and left directions on the paper surface) indicated by the arrow 105 by the thermal annealing. Then, in the region where crystal growth has been developed in the lateral direction, the source region 111, the drain region 113 and the channel forming region 112 are formed as the PTFT. Likewise, the source region 114, the drain region 116 and the channel forming region 115 are formed as the NTFT. That is, in the peripheral circuit portion, between the source and drain, a direction in which carriers move is identical with the direction 105 in which crystal grows. Consequently, since the carriers do not traverse the grain boundaries when moving, mobility can be particularly made high.

On the other hand, in the NTFT formed in the pixel portion shown in FIG. 4D, as shown in FIG. 5, since the carriers moving in the source and drain regions are perpendicular to the crystal growing direction 105, they must cross a large number of grain boundaries when moving. That is, a resistance between the source and the drain is heightened, and both values of the on-state current and the off-state current are made small. However, since the absolute value of the off-state current can be made small, the function of the pixel electrode (the ITO electrode 212 in the case of FIG. 4D) for holding charge is improved. Therefore, if the on/off ratio required is obtained, then it is useful to select the structure shown in FIGS. 4D and 5 to apply the TFT having a small off-state current to the pixel electrode.

In this embodiment, as a method of introducing Ni, a method of selectively forming the Ni thin film (since it is extremely thin, it is difficult to observe it as a film) on the surface of the underlying film 102 under the amorphous silicon film 104 and then developing crystal growth from that portion is applied. Otherwise, after the amorphous silicon film 104 is formed, a small amount of nickel may be selectively added onto the upper surface thereof. That is, crystal growth may be made from the upper surface of the amorphous silicon film or from the lower surface thereof. Further, there may be applied a method in which the amorphous silicon film has been previously formed, and then nickel ions are selectively injected into the amorphous silicon film 104 by using an ion doping method. In this case, there is advantageous in that the density of the nickel element can be controlled. Furthermore, instead of forming a thin film made of nickel, a small amount of nickel may be added by a plasma treatment.

The circuit shown in FIG. 2D is of the complementary type CMOS structure having the PTFT and the NTFT. Alternatively, in the above-mentioned process, two TFTs may be simultaneously manufactured and then cut off in the center thereof, thereby being capable of simultaneously manufacturing independent two TFTs.

In the active matrix type liquid-crystal display device, the TFT in the peripheral circuit portion is constituted by the crystalline silicon film resulting from making crystal grow in a direction parallel with the flow of carriers, and the TFT in the pixel portion is constituted by the crystalline silicon film resulting from making crystal grow in a direction perpendicular to the flow of carriers, as a result of which the peripheral circuit portion can be constituted so as to perform a high-speed operation whereas the pixel portion can be constituted so as to provide the TFT having a small off-state current value required for charge retention.

The foregoing description of preferred embodiments of the invention has been presented for purposes of illustration and description. It is not intended to be exhaustive or to limit the invention to the precise form disclosed, and modifications and variations are possible in light of the above teachings or may be acquired from practice of the invention. The embodiments were chosen and described in order to explain the principles of the invention and its practical application to enable one skilled in the art to utilize the invention in various embodiments and with various modifications as are suited to the particular use contemplated. It is intended that the scope of the invention be defined by the claims appended hereto, and their equivalents.

What is claimed is:

1. A method for manufacturing a semiconductor device comprising the steps of:

forming a substantially amorphous silicon film on a substrate;

introducing a metal element for promoting crystallization into said silicon film before or after the formation of said silicon film;

crystallizing said silicon film by heating so that a crystal grows in a direction approximately parallel with a surface of said substrate in a region adjacent to a portion into which said metal element is added; and forming a plurality of thin film transistors within said region of the silicon film, wherein a part of said thin film transistors are arranged in such a manner that the crystal growth direction of the crystalline silicon film thereof forms a first angle with respect to a direction along which carriers flow therein while another part of said thin film transistors are arranged in such a manner that the crystal growth direction of the crystalline silicon film thereof forms a second angle with respect to a direction along which carriers flow therein, said first angle being different from said second angle.

2. The method of claim 1 wherein said first angle is approximately 0° while said second angle is approximately 90°.

3. The method of claim 1 or 2 wherein said metal element is at least one selected from the group consisting of Ni, Co, Pd, and Pt.

4. A method for manufacturing a semiconductor device comprising the steps of:

preparing a substrate having a peripheral circuit portion and a pixel portion for an active matrix type liquid crystal display device;

forming a substantially amorphous silicon film on said substrate;

introducing a metal element for promoting crystallization into said silicon film before or after the formation of said silicon film;

crystallizing said silicon film by heating so that a crystal grows in a direction approximately parallel with a surface of said substrate in a region adjacent to a portion into which said metal element is added; and forming a plurality of thin film transistors within said region of the silicon film, wherein a first part of said thin film transistors are arranged in such a manner that the crystal growth direction of the crystalline silicon film thereof forms a first angle with respect to a direction along which carriers flow therein while a second part of said thin film transistors are arranged in such a manner that the crystal growth direction of the crystalline silicon film thereof forms a second angle with respect to a direction along which carriers flow therein, said first angle being different from said second angle, and wherein said first part of the thin film transistors are provided in the peripheral circuit portion of the substrate while said second part of the thin film transistors are provided in the pixel portion of the substrate.

5. The method of claim 4 wherein said first angle is approximately 0° while said second angle is approximately 90°.

6. The method of claim 4 or 5 wherein said metal element is at least one selected from the group consisting of Ni, Co, Pd, and Pt.

* * * * *

UNITED STATES PATENT AND TRADEMARK OFFICE
CERTIFICATE OF CORRECTION

PATENT NO.   : 5,614,426
DATED        : March 25, 1997
INVENTOR(S)  : Fumiaki FUNADA et al.

It is certified that error appears in the above-indentified patent and that said Letters Patent is hereby corrected as shown below:

On the Title page, item [73] Assignee should read --
　　　　　Semiconductor Energy Laboratory
　　　　　Co., Ltd., Kanagawa-ken, Japan
　　　　　　　　　　　and
　　　　　Sharp Corporation, Osaka, Japan --.

Signed and Sealed this

Fifth Day of August, 1997

Attest:

BRUCE LEHMAN

*Attesting Officer*　　　　*Commissioner of Patents and Trademarks*